United States Patent [19]

Hernandez

[11] Patent Number: 4,853,826
[45] Date of Patent: Aug. 1, 1989

[54] LOW INDUCTANCE DECOUPLING CAPACITOR

[75] Inventor: Jorge M. Hernandez, Mesa, Ariz.

[73] Assignee: Rogers Corporation, Rogers, Conn.

[21] Appl. No.: 226,602

[22] Filed: Aug. 1, 1988

[51] Int. Cl.⁴ .............................................. H01G 1/14
[52] U.S. Cl. ..................................................... 361/306
[58] Field of Search ...................... 357/70; 324/158 F; 174/52 FP; 361/321 C, 321 DC, 306

[56] References Cited

U.S. PATENT DOCUMENTS

| | | | |
|---|---|---|---|
| 3,691,289 | 9/1972 | Rohloff | 357/70 |
| 4,584,627 | 4/1986 | Schilling et al. | 361/306 |
| 4,734,818 | 3/1988 | Hernandez et al. | 361/321 X |

*Primary Examiner*—Donald Griffin
*Attorney, Agent, or Firm*—Fishman, Dionne & Cantor

[57] ABSTRACT

A decoupling capacitor is presented which is particularly useful in conjunction with either pin grid array type IC packages or with plastic leaded chip carrier IC packages. In accordance with the present invention, the multiplicity of elongated conductors of prior art decoupling capacitors are replaced with flat, wide conductive strips termed herein as skirts. These skirts extend outwardly from the top and bottom conductors of the decoupling capacitor and include small leads extendng therefrom which are solely for the purpose of either insertion into the circuit board or for connection with a surface pad on the circuit board. Thus, rather than the multiplicity of elongated leads found in the prior art, the present invention utilizes flat strips or skirts having very small leads extending therefrom. This skirt construction provides far lower inductance relative to the elongated leads of the prior art.

27 Claims, 7 Drawing Sheets

LOW INDUCTANCE DECOUPLING CAPACITOR

BACKGROUND OF THE INVENTION

This invention relates to the field of decoupling capacitors for integrated circuits. More particularly, this invention relates to novel and improved decoupling capacitors especially suitable for use in conjunction with Pin Grid Array (PGA) and Plastic Leaded Chip Carrier (PLCC) type integrated circuit packages.

It is well known in the field of microelectronics that high frequency operation, particularly the switching of integrated circuits, can result in transient energy being coupled into the power supply circuit. Generally, the prevention of the coupling of undesired high frequency noise or interference into the power supply for an integrated circuit is accomplished by connecting a decoupling capacitor between the power and the ground leads of the IC.

One connection scheme which has been found to be quite successful is to mount a decoupling capacitor underneath an integrated circuit. Such decoupling capacitors are commercially available from Rogers Corporation, (assignee of the present application) and are sold under the trademark MICRO Q. Examples of these decoupling capacitors are found in U.S. Pat. Nos. 4,475,143, 4,502,101, and 4,748,537, all of which are assigned to the assignee hereof.

U.S. Pat. Nos. 4,626,958, 4,667,267, 4,658,327, 4,734,818 and 4,734,819 are also assigned to the assignee hereof and incorporated herein by reference. These patents disclose decoupling capacitors which are particularly well suited for pin grid array and plastic leaded chip carrier packages. For example, the PGA decoupling capacitor of U.S. Pat. No. 4,626,958 comprises a dielectric material sandwiched between a pair of conductors. A plurality of leads are provided along the periphery of each conductor. These leads extend outwardly a short distance generally in the plane of the metal conductors to which they are attached and are then bent downwardly so as to extend in a direction which is perpendicular to the planes of the conductors. The entire assembly, with the exception of the plural transversely extending lead portions, may then be encapsulated within a suitable non-conductive material.

This flat decoupling capacitor adapted for mounting directly under a Pin Grid Array package will result in a lower decoupling loop, thus providing a more effective decoupling scheme. The capacitor of U.S. Pat. No. 4,626,958 also contributes to a savings in board space, i.e. takes up less "real estate" on the printed circuit board, by resting entirely under the PGA package.

It will be appreciated that the decoupling capacitor of U.S. Pat. No. 4,626,958 features a multiplicity of elongated leads for (1) reduced lead inductance; and (2) increased current capability. Similarly, the decoupling capacitor for PLCC's disclosed in U.S. Pat. Nos. 4,658,327 and 4,734,818 also feature a multiplicity of elongated leads for reducing lead inductance and increasing current capability.

While suitable for its intended purposes, the use of a multiplicity of discrete elongated leads does pose certain drawbacks and practical limitations. An important drawback is that the larger the number of elongated leads, the lower the reduction rate of inductance. Thus, the greater the number of leads, the lower the inductance but only to a point, beyond which, no significant reduction of inductance is achieved and another problem is created. This other problem is that the use of a large number of leads necessitates the burdensome provision of adequate numbers of holes in the printed circuit board.

SUMMARY OF THE INVENTION

The above-discussed and other problems and deficiencies of the prior art are overcome or alleviated by the novel decoupling capacitor of the present invention which is particularly useful in conjunction with either pin grid array type IC packages or with plastic leaded chip carrier IC packages. In accordance with the present invention, the multiplicity of elongated conductors of prior art decoupling capacitors are replaced with flat, wide conductive strips termed herein as "skirts". These skirts extend outwardly from the top and bottom conductors of the decoupling capacitor and include small leads extending therefrom which are solely for the purpose of either insertion into the circuit board or for connection with a surface pad on the circuit board. Thus, rather than the multiplicity of elongated leads found in the prior art, the present invention utilizes flat strips or skirts having very small leads extending therefrom. This skirt construction provides far lower inductance relative to the elongated leads of the prior art.

The above discussed and other features and advantages of the present invention will be appreciated and understood by those of ordinary skill in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1A:
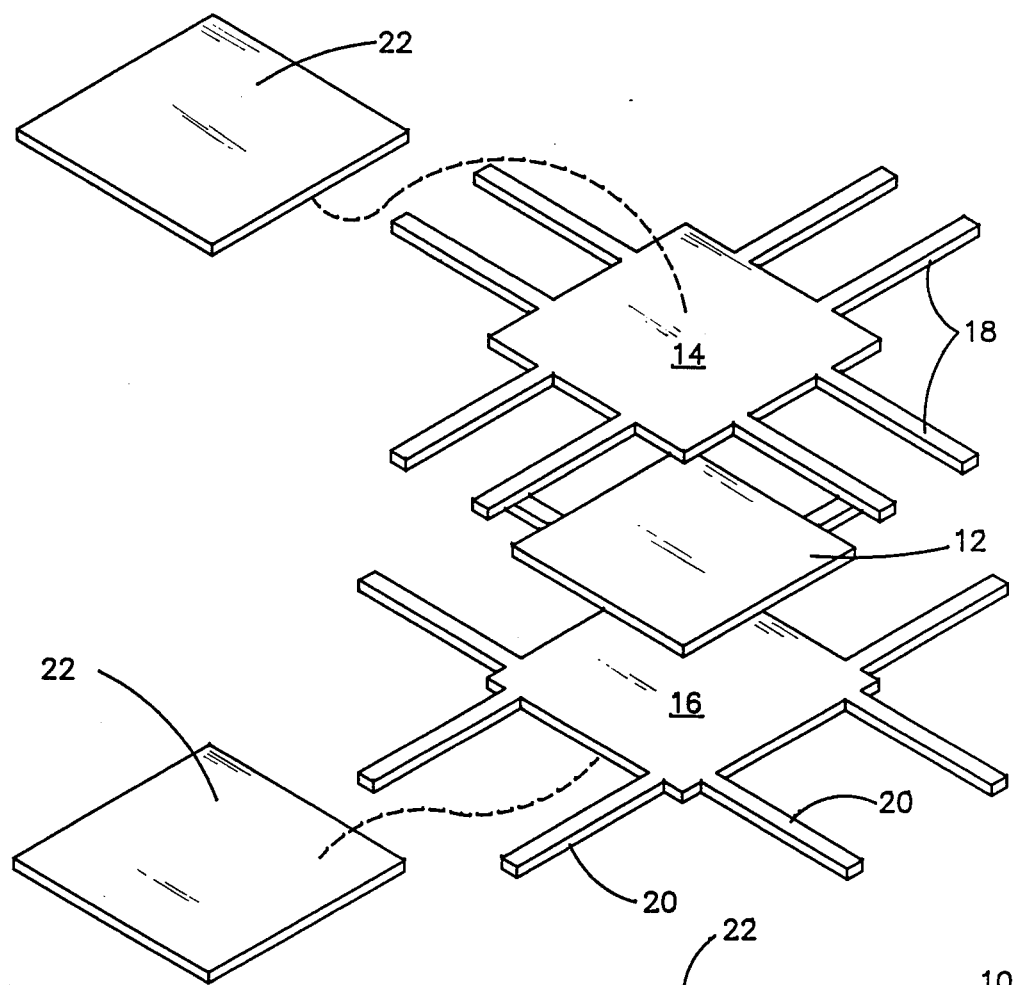
FIG. 1A is an exploded view of a decoupling capacitor for use with a PGA package in accordance with the prior art.
Figure 1B:
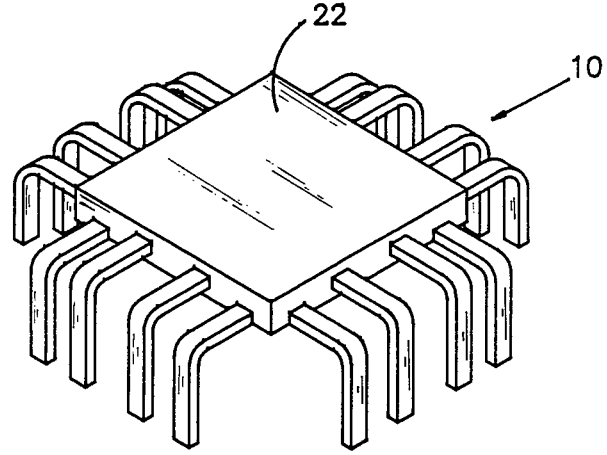
FIG. 1B is a perspective view of the assembled decoupling capacitor of FIG. 1A.

Referring first to FIG. 1A and 1B, a decoupling capacitor of the type disclosed in U.S. Pat. No. 4,626,958 for use in conjunction with a PGA package is shown generally at 10. Decoupling capacitor 10 is comprised of dielectric material or dielectric chip 12 sandwiched between a pair of metal conductors 14 and 16. Each conductor 14, 16 has a plurality of leads 18 and 20 which ar connected thereto and extend outwardly therefrom. The leads extend outwardly a short distance and then are bent downwardly so as to extend in the direction which is perpendicular to the planes of the conductors. The entire assembly, with the exception of the plural transversely extending lead portions are then encapsulated within a suitable non-conductive material 22.

The decoupling capacitor 10 of FIGS. 1A and 1B utilize a multiplicity of elongated leads 18 and 20. As will be discussed in more detail hereinafter in conjunction with FIG. 12, elongated leads 18 and 20 lead to higher inductance which limits the bandwidth of the decoupling capacitor. It will be appreciated that the term "bandwidth" is equivalent to the useful frequency wherein the capacitor can be used as an effective decoupler. It will further be appreciated that by minimizing inductance, greater bandwidths may be achieved.

Figure 2A:
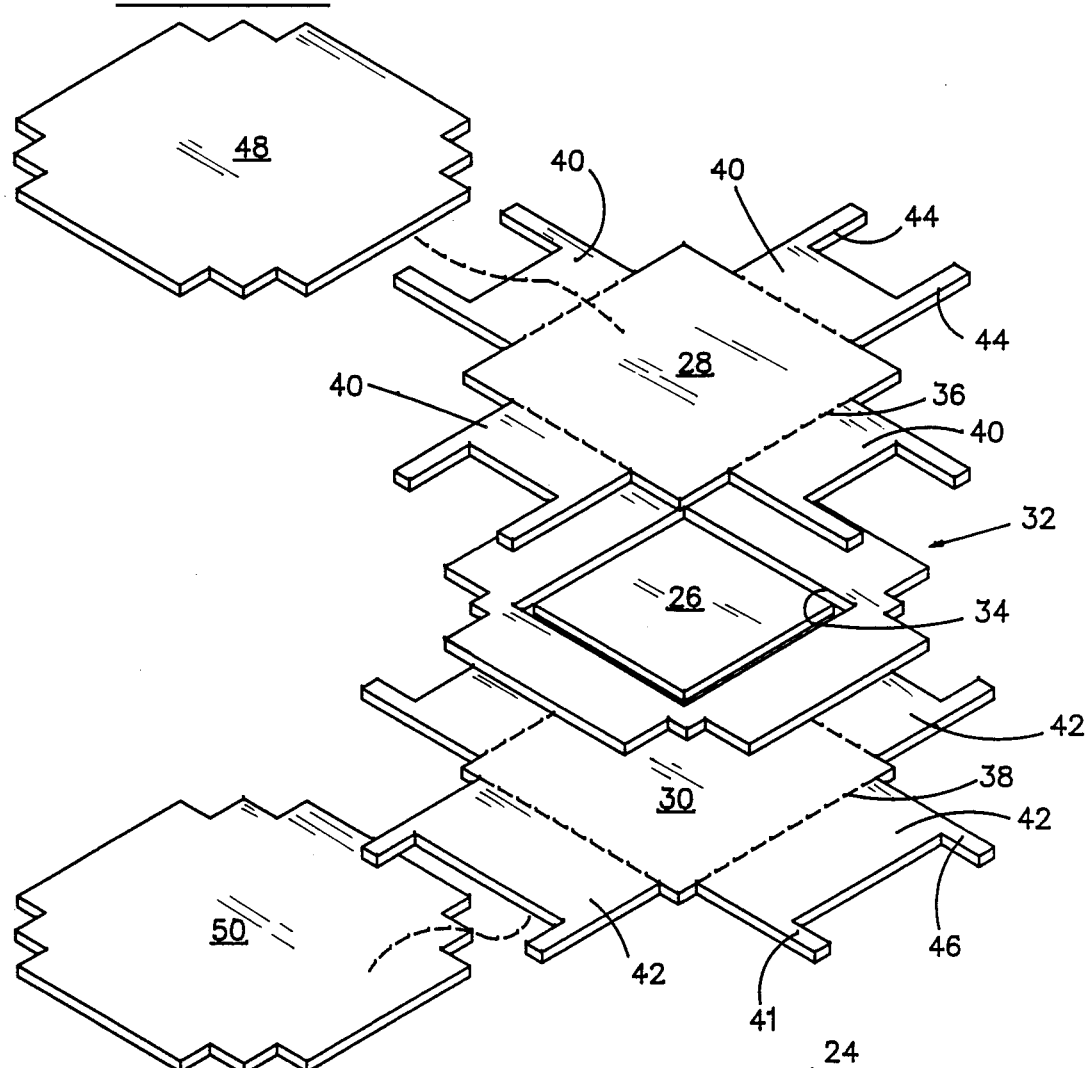
FIG. 2A is an exploded perspective view of a decoupling capacitor for use with a PGA package in accordance with the present invention.
Figure 2B:
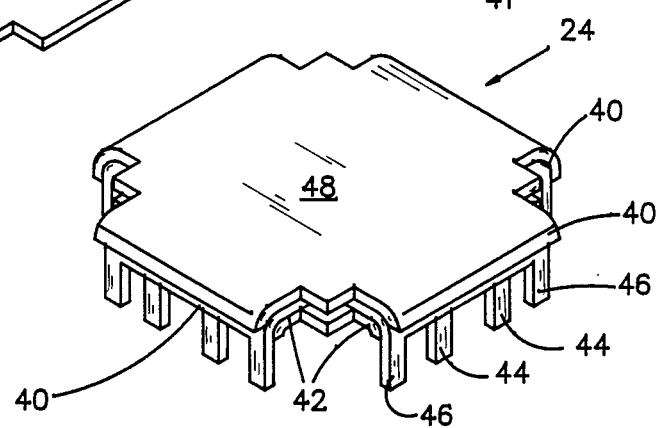
FIG. 2B is a perspective view of the decoupling capacitor of FIG. 2A subsequent to assembly.
Figure 3:
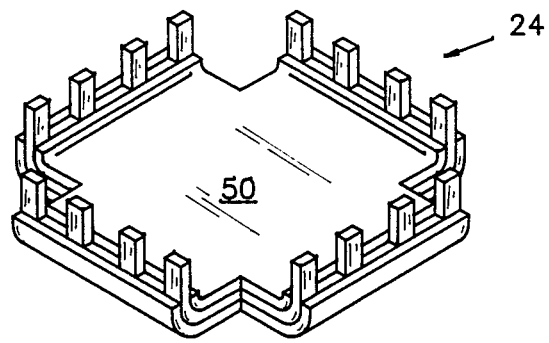
FIG. 3 is a bottom perspective view of the decoupling capacitor of FIG. 2B.

Turning now to FIGS. 2A, 2B and 3, a decoupling capacitor for use with a PGA IC package in accordance with the present invention is shown generally at 24. Decoupling capacitor 24 is comprised of a single layer of dielectric material or a dielectric chip 26 which is sandwiched between a pair of upper and lower metal conductors 28 and 30. A suitably configured insulating sheet 32 having an opening 34 through the center thereof receives dielectric chip 26 and electrically insulates and avoids electrical contact between conductors 28 and 30. Each conductor 28 and 30 includes a rectangular or square main body portion delineated by the dashed lines 36 and 38. Extending outwardly from each of the four sides of main body portions 36 and 38 is a wide, flat plate or skirt identified at 40 in conductor 28 and at 42 in conductor 30. In addition, each skirt 40 and 42 includes a pair of shortened leads 44 and 46 which extend therefrom. Note that each skirt 40 and 42 has a width which is less than the width of main body portions 28 and 30.

When comparing FIGS. 1A and 2A, it will be appreciated that main body portions 28 and 30 of FIG. 2A corresponds to the entire body of conductors 14 and 20 respectively of FIG. 1A. The significant structural difference between the decoupling capacitors of FIGS. 2A and 1A is that in FIG. 2A, conductors 28 and 30 have, in addition to main body portions 28 and 30, skirts 40 and 42 and the short stubby leads 44 and 46.

Still referring to FIGS. 2A, 2B and 3, it will be appreciated that insulating layer 32 has an outer perimeter having a shape which is commensurate to the shape of both conductors 28 and 30 to provide complete electrical insulation between the conductors. When conductors 28 and 30 sandwich both insulating layer 32 and dielectric chip 26 together, the skirt sections of conductors 28, 30 and insulating layer 32 are bent downwardly along dashed lines 36 and 38 to define the decoupling capacitor shown in FIG. 2B. Thereafter, an insulating material which may consist of a pair of top and bottom insulating layers 48 and 50 are provided over the exposed surfaces of conductors 28 and 30 to provide an insulated assembly. Note that upper and lower insulating layers 40 and 50 will not cover the short, stubby leads 44 and 46.

Figure 4:
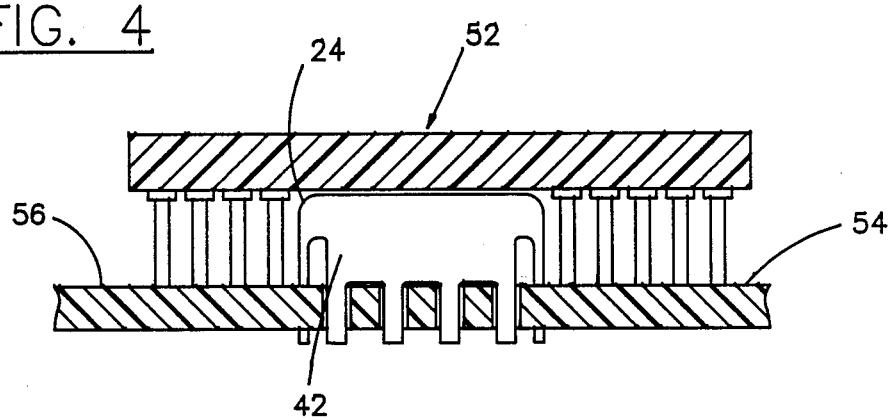
FIG. 4 is a side elevation view, partly in cross section, of the decoupling capacitor of FIG. 2B mounted underneath a PGA package.

Turning now to FIG. 4, an assembly is shown of a known pin grid array package 52 mounted on circuit board 54 and having a decoupling capacitor 24 of the present invention interposed between PGA package 52 and circuit board 54. As shown in FIG. 4 and in the enlarged view of FIG. 5, skirts 40 and 42 are configured to extend downwardly and be flush with the upper surface 56 of printed circuit board 54. Similarly, the short leads 44 and 46 are configured to enter and extend into the plated through holes 58 in circuit board 54. Each lead 44 and 46 is mechanically and electrically connected to plated throughole 58 by a solder filet 60.

Figure 5:
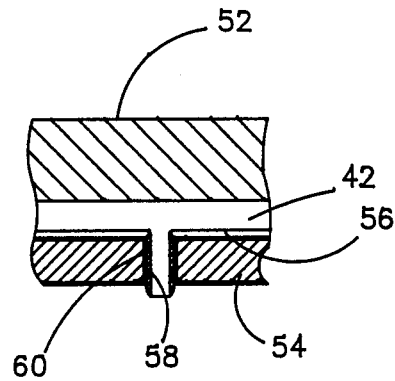
FIG. 5 is an enlarged side elevation view, partly in cross section, showing a portion of the installed decoupling capacitor of FIG. 4.

Thus, as can be clearly seen in FIGS. 4 and 5, the seating plane of the PGA decoupling capacitor of the present invention is defined by the end portions of skirts 40 and 42. In addition, solder will wick up inside the plated through holes thereby creating a filet that will reach upward to the end of the skirts. This will essentially provide the insertion lead with a much larger cross sectional area thus minimizing its contribution to inductance. It will be appreciated that an incidental feature of the skirt construction of the present invention is that said skirts will create a stand-off to provide a desirable gap under the decoupling capacitor for flux cleaning purposes.

It will be further appreciated that in contrast to the prior art PGA decoupling capacitor shown in FIGS. 1A and 1B, wherein said decoupling capacitors utilized a multiplicity of elongated leads, in the present invention lead inductance is not only reduced but is minimized since the leads are not "discrete" strips of metal, but instead comprise a skirt which is a substantially solid continuous block of metal.

Figure 6:
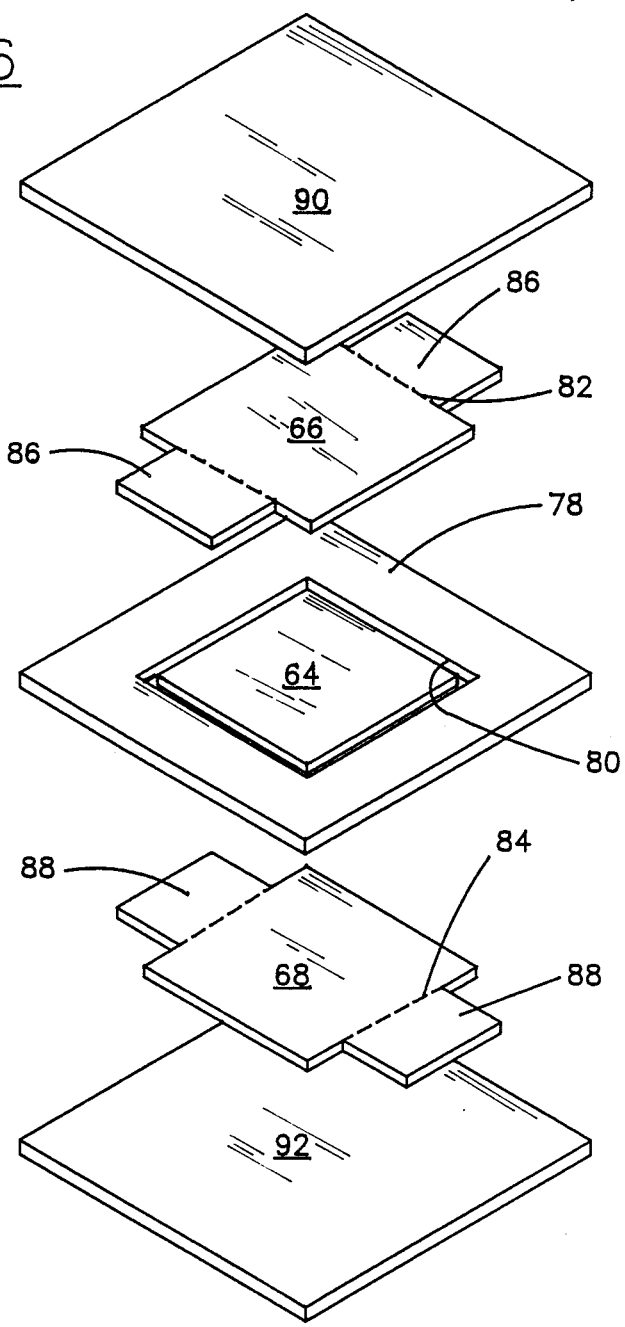
FIG. 6 is an exploded perspective view of a decoupling capacitor for use with a PLCC in accordance with the present invention.
Figure 7:
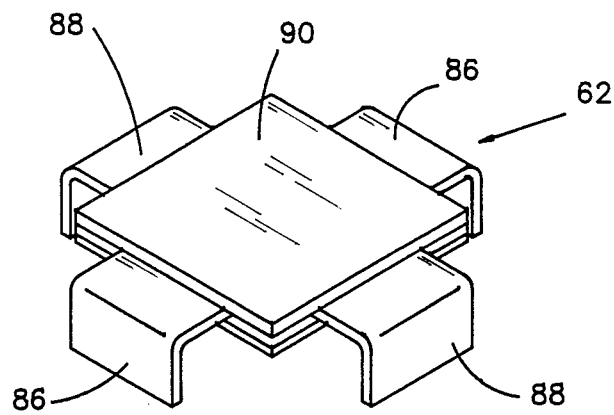
FIG. 7 is a top perspective view of the decoupling capacitor of FIG. 6 subsequent to assembly.

The improved decoupling capacitor described in detail above for use with a PGA package is similarly well suited for use in conjunction with plastic leaded chip carriers (PLCC's) as will be discussed in conjunction with FIGS. 6–11. Referring now to FIGS. 6–7, a decoupling for use with a PLCC is shown generally at 62 and is comprised of a single layer of dielectric material or chip 64 which is sandwiched between a top conductor 66 and a bottom conductor 68. An insulating layer 78 having a central opening 80 therethrough receives dielectric chip 64 and provides electrical insulation between conductors 66 and 68. Each of conductors 66 and 68 include a central, rectangular or square area denoted by the dashed lines 82 and 84. Extending from this central rectangular or square areas 82 and 84 are extension members or skirts 86 and 88, respectively.

Figure 8:
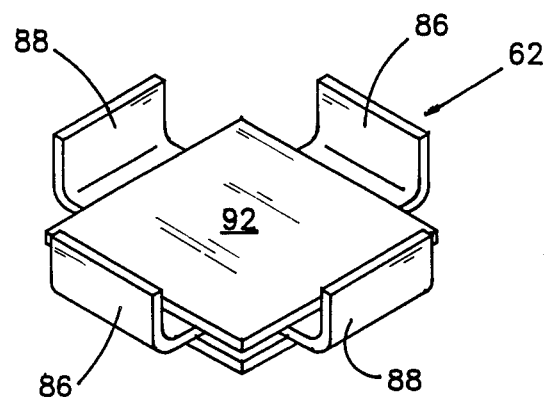
FIG. 8 is a bottom perspective view of the decoupling capacitor of FIG. 7.

Again, as in the embodiment of FIG. 2B, in the embodiment of FIGS. 6–8, the central square areas 82 and 84 of conductors 66 and 68 correspond to the square conductors 14 and 16 of the prior art decoupling capacitor shown in FIGS. 1A and 1B. Thus, an important feature of the present invention as shown in FIGS. 6–8 is the addition of the skirt portions 86 and 88 extending from the two opposed sides of central areas 82 and 84. Subsequent to assembly, skirt portions 86 and 88 are bent downwardly as shown in FIGS. 7 and 8 at approximately right angles to conductors 66 and 68. Note that an appropriate insulating material such as top and bottom insulating layers 90 and 92 are provided to conductors 66 and 68, respectively, to provide electrical insulation to the conductors.

Figure 10:
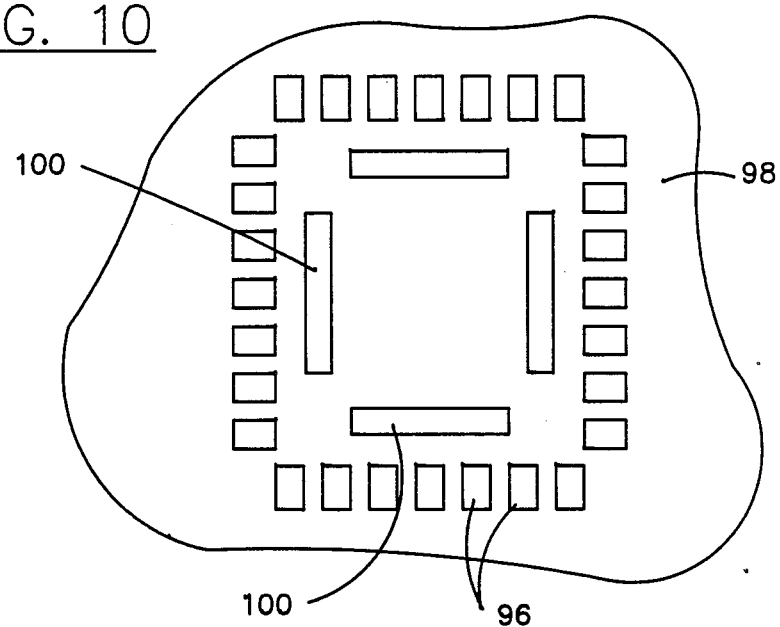
FIG. 10 is a plan view showing a mounting pad configuration suitable for installation of the decoupling capacitors of FIGS. 7 or 9 onto a printed circuit board.
Figure 11:
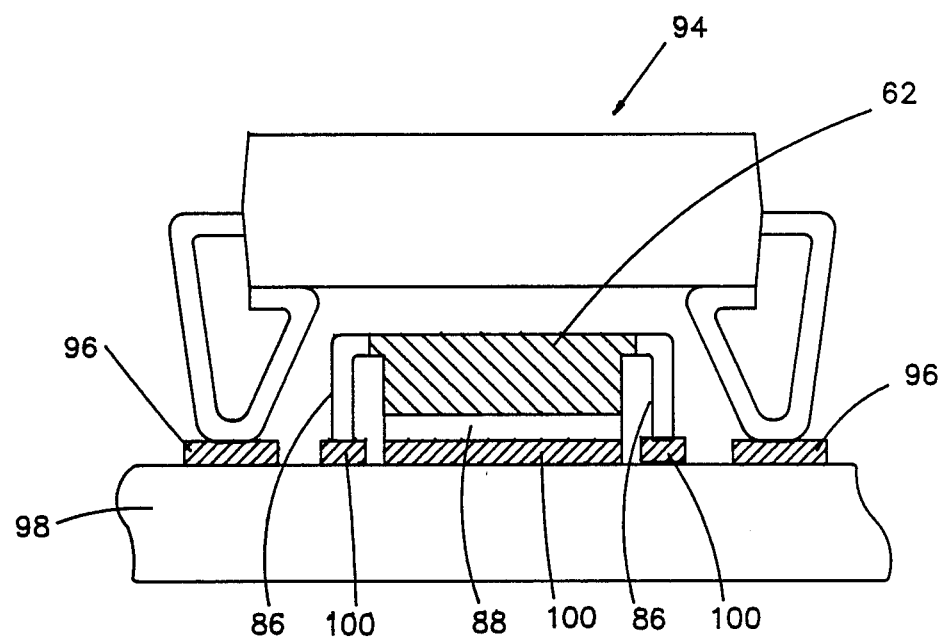
FIG. 11 is a side elevation view, partly in cross section, showing the decoupling capacitor of FIG. 7 mounted on the printed circuit board of FIG. 10 and underneath a plastic leaded chip carrier.

The downwardly bent skirt sections 86 and 88 result in a flat longitudinal foot print for each of the four sides of the decoupling capacitor 62. Referring now to FIGS. 10 and 11, it will be appreciated that a known plastic leaded chip carrier (PLCC) shown generally at 94 will be positioned on the plurality of solder pads 96 on a circuit board 98 in a known fashion. Decoupling capacitor 62 is then mounted on inner elongated solder pads 100 so that the elongated skirt sections 86 and 88 contact solder pads 100 as shown in FIG. 11. Thus, in accordance with the present invention, a decoupling capacitor may be mounted between a PLCC and a circuit board to accomplish decoupling of the integrated circuit in the PLCC as is well known, for example, see U.S. Pat. Nos. 4,658,327 and 4,734,818.

Figure 9:
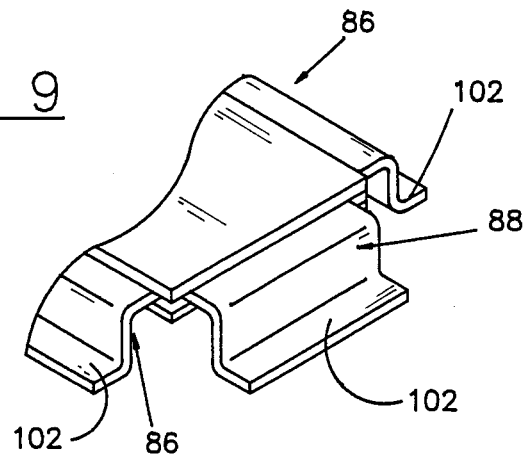
FIG. 9 is a partial perspective view of an alternative embodiment of the decoupling capacitor of FIG. 7.

Rather than skirt portions 86 and 88 terminating as shown in FIG. 8, in an alternative embodiment shown in FIG. 9, the skirt portions may terminate in a "gull wing" configuration wherein there is a final 90° bend 102 which provides both a larger foot print relative to the skirt portion of FIG. 8 and provides better heat cycling reliability.

Figure 12:
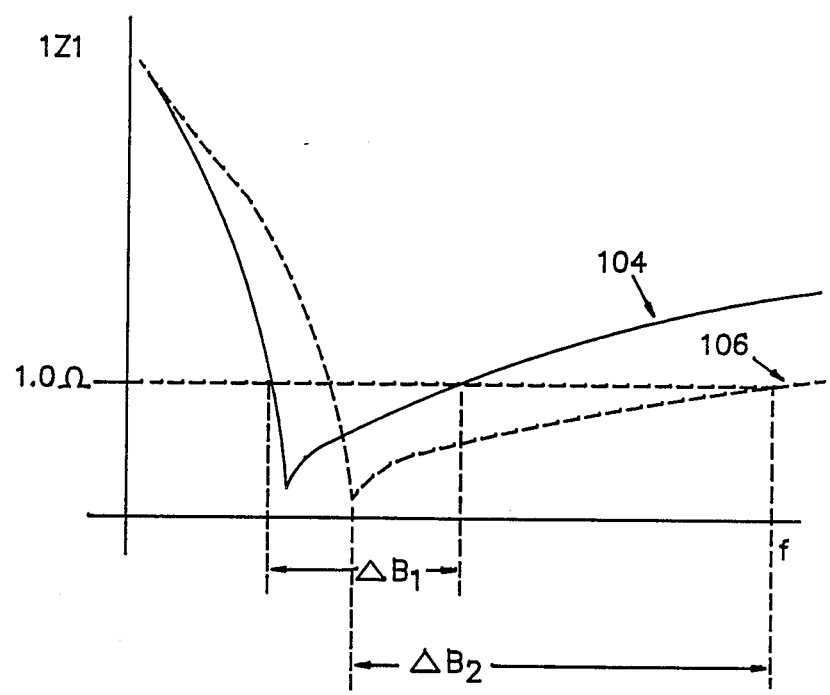
FIG. 12 is a diagram showing impedance versus frequency for a prior art decoupling capacitor and a decoupling capacitor in accordance with the present invention.

The decoupling capacitor of the present invention provides marked advantages relative to prior art decoupling capacitors such as shown in U.S. Pat. Nos. 4,667,267, 4,658,327, 4,734,818 and 4,734,819; and FIGS. 1A and 1B. Turning to FIG. 12, an important feature and advantage relative to the prior art is shown in the graph of impedance versus frequency. It will be appreciated that if possible, the useful operating impedance for a decoupling capacitor should be less than 1 OHM. In the prior art decoupling capacitor identified by the curve 104, the useful frequency range for operating at an impedance of less than 1 OHM is relatively small and is defined as a bandwidth $\Delta B1$. In distinct contrast, in accordance with the present invention, the number of useful frequencies (e.g. bandwidth) wherein the present invention can be used as an effective decoupler is far greater as shown in the comparison between curve 106 (the present invention) and curve 104. Thus, in the present invention, the bandwidth $\Delta B2$ is far greater than bandwidth $\Delta B1$. Thus, by minimizing inductance through the use of the "skirt" construction (rather than elongated discrete leads of the prior art), the present invention achieves far greater bandwidth relative to the prior art. This is particularly important in developing electronic technology wherein minimization of inductance is of growing importance as higher frequencies are implemented.

It will be appreciated that while the present invention has been described as utilizing a single layer dielectric, this invention also contemplates the utilization of multilayer chip capacitors such as shown in U.S. Pat. Nos. 4,667,267 and 4,734,818. Preferably, if a multilayer capacitive element is employed, a capacitor of the type disclosed in FIGS. 4 and 10 of U.S. Pat. No. 4,748,537 and FIGS. 11-16 of U.S. Pat. No. 4,706,162 (both of which are assigned to the assignee hereof and incorporated herein by reference) is used. This preferred multilayer capacitor includes exposed top and bottom electrodes which provide a low inductance parallel-plate type capacitive structure.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A decoupling capacitor comprising:
    a capacitive element having a pair of opposed surfaces;
    a first multi-sided conductor on one of said opposed surfaces of said capacitive element;
    a second multi-sided conductor on the other of the said opposed surfaces of said capacitive element;
    a plurality of first skirt means extending outwardly and downwardly from said first conductor, one each of said first skirt means extending from at least two of said sides of said first conductor; and
    a plurality of second skirt means extending outwardly and downwardly from said second conductor, one each of said second skirt means extending from at least two of said sides of said second conductor.

2. The capacitor of claim 1 including:
    a layer of insulative material having a central opening therethrough for receiving said capacitive element, said insulative layer being sandwiched between said first and second conductors.

3. The capacitor of claim 1 including:
    an insulating material surrounding said first and second conductors with said first and second skirt means extending through said insulating material.

4. The capacitor of claim 1 wherein:
    said capacitive element comprises a flat layer of dielectric material.

5. The capacitor of claim 1 wherein:
    said capacitive element comprises a multilayer capacitor chip.

6. The capacitor of claim 1 wherein:
    said first and second conductors have a rectangular shape with four skirt means extending from each conductor.

7. The capacitor of claim 6 wherein:
    said first and second conductors have a square shape.

8. The capacitor of claim 1 wherein:
    said skirt means include a plurality of leads extending therefrom.

9. The capacitor of claim 1 wherein:
    said skirt means extends downwardly at about a 90 degree angle with respect to said conductors.

10. The capacitor of claim 9 wherein:
    said skirt means terminate at an additional 90 degree bend.

11. The capacitor of claim 1 wherein:
    said first and second conductors have a rectangular shape with the two skirt means extending from opposed sides of each conductor.

12. A decoupling capacitor for use with a pin grid array package, the pin grid array package having an array of pins extending from one side thereof and surrounding a central pin free area of a predetermined size, at least some of the pins surrounding the central pin free area being first and second voltage level pins, the capacitor including:
    a capacitive element having a pair of opposed surfaces;
    a first multi-sided conductor on one of said opposed surfaces of said capacitive element defining a first voltage level conductor;

a second multi-sided conductor on the other of the said opposed surfaces of said capacitive element defining a second voltage level conductor;

a plurality of first skirt means extending outwardly and downwardly from said first conductor, one each of said first skirt means extending from at least two of said sides of said first conductor;

a plurality of second skirt means extending outwardly and downwardly from said second conductor, one each of said second skirt means extending from at least two of said sides of said second conductor;

a plurality of first leads in a predetermined configuration in electrical contact with said first skirt means and extending outwardly therefrom;

a plurality of second leads in a predetermined configuration in electrical contact with said second skirt means and extending outwardly therefrom;

the configurations of said first and second leads corresponding to configurations of first and second voltage levels of pins of the pin grid array package;

an insulating material surrounding said first and second skirt means extending through said insulating material; and said capacitive element, first conductor, second conductor and insulating material defining an insulated assembly, the size of said insulated assembly being less than the size of the central pin free area.

13. The capacitor of claim 12 wherein:
said insulated assembly is substantially rectangular.

14. The capacitor of claim 13 wherein:
said insulated assembly is substantially square.

15. The capacitor of claim 12 including:
a layer of insulative material having a central opening therethrough for receiving said capacitive element, said insulative layer being sandwiched between said first and second conductors.

16. The capacitor of claim 12 wherein:
said capacitive element comprises a flat layer of dielectric material.

17. The capacitor of claim 12 wherein:
said capacitive element comprises a multilayer capacitor chip.

18. The capacitor of claim 12 wherein:
said first and second conductors have a rectangular shape with four skirt means extending from each conductor.

19. The capacitor of claim 18 wherein:
said first and second conductors have a square shape.

20. A decoupling capacitor for use with a surface mounted integrated circuit chip carrier package, the chip carrier package having a plurality of surface mountable leads extending therefrom, the chip carrier package having a central lead free area of predetermined size with at least some of the leads surrounding the central lead free area being first and second voltage level leads, the capacitor including:

a capacitive element having a pair of opposed surfaces;

a first conductor on one of said opposed surfaces of said capacitive element defining a first voltage level conductor;

a second conductor on the other of said opposed surfaces of said capacitive element defining a second voltage level conductor;

a plurality of first skirt means extending outwardly and downwardly from said first conductor, one each of said first skirt means extending from at least two of said sides of said first conductor;

a plurality of second skirt means extending outwardly and downwardly from said second conductor, one each of said second skirt means extending from at least two of said sides of said second conductor;

said first and second skirt means being formed for surface mounting on a circuit board;

the configurations of said first and second skirt means corresponding to configurations of first and second voltage levels of said leads of said chip carrier package;

an insulating material surrounding said conductors, said first and second skirt means extending through said insulating material; and said capacitive element, first conductor, second conductor and insulating material defining an insulated assembly, the size of said insulated assembly being less than the size of the central lead free area.

21. The capacitor of claim 20 wherein:
said insulated assembly is substantially square.

22. The capacitor of claim 21 wherein:
said insulated assembly is substantially square.

23. The capacitor of claim 20 including:
a layer of insulative material having a central opening therethrough for receiving said capacitive element, said insulative layer being sandwiched between said first and second conductors.

24. The capacitor of claim 20 wherein:
said capacitive element comprises a flat layer of dielectric material.

25. The capacitor of claim 20 wherein:
said capacitive element comprises a multilayer capacitor chip.

26. The capacitor of claim 20 wherein:
said first and second conductors have a rectangular shape with four skirt means extending from each conductor.

27. The capacitor of claim 26 wherein:
said first and second conductors have a square shape.

* * * * *